US012787270B2

(12) United States Patent
Masoero et al.

(10) Patent No.: US 12,787,270 B2
(45) Date of Patent: Nov. 3, 2026

(54) ONE-TIME PROGRAMMABLE MEMORY CELL

(71) Applicant: STMicroelectronics (Rousset) SAS, Rousset (FR)

(72) Inventors: Lia Masoero, Marseilles (FR); Patrick Calenzo, Peypin (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 1105 days.

(21) Appl. No.: 17/861,329

(22) Filed: Jul. 11, 2022

(65) Prior Publication Data

US 2023/0019484 A1 Jan. 19, 2023

(30) Foreign Application Priority Data

Jul. 13, 2021 (FR) ....................................... 2107602

(51) Int. Cl.
*H10B 20/25* (2023.01)

(52) U.S. Cl.
CPC .................................... *H10B 20/25* (2023.02)

(58) Field of Classification Search
CPC ...................................................... H10B 20/25
See application file for complete search history.

(56) References Cited

U.S. PATENT DOCUMENTS 4,683,486 A 7/1987 Chatterjee
5,066,608 A * 11/1991 Kim .................... H10B 12/377 438/246
2013/0037879 A1 2/2013 Filippini et al.
2013/0279234 A1 10/2013 Shin et al.
2014/0321190 A1 10/2014 Shepard
2017/0213598 A1 7/2017 Asami
2020/0051653 A1 2/2020 Kurjanowicz

FOREIGN PATENT DOCUMENTS

CN 101908380 A 12/2010
CN 218244271 U 1/2023
KR 1020150117595 A 10/2015

OTHER PUBLICATIONS

INPI Search Report and Written Opinion for priority application, FR 2107602, report dated Mar. 15, 2022, 9 pgs.
CN First Office Action and Search Report for counterpart CN Appl. No. 202210819607.7, report dated May 31, 2025, 7 pgs.
CN Notice of Allowance for Counterpart CN Appl. No. 202210819607.7, report daed 23-Jul. 2026, 4 pgs.

* cited by examiner

*Primary Examiner* — Richard A Booth
(74) *Attorney, Agent, or Firm* — Crowe & Dunlevy LLC

(57) ABSTRACT

A one-time programmable memory cell includes a transistor coupled to a capacitor. The transistor includes at least one first conductive gate element arranged in at least one first trench formed in a semiconductor substrate, and at least one first channel portion buried in the substrate and extending at the level of at least a first lateral surface of the at least one first conductive gate element. The capacitor includes a capacitive element forming a memory. The at least one first channel portion is electrically coupled to an electrode of the capacitive element.

20 Claims, 4 Drawing Sheets

ONE-TIME PROGRAMMABLE MEMORY CELL

PRIORITY CLAIM

This application claims the priority benefit of French Application for Patent No. 2107602, filed on Jul. 13, 2021, the content of which is hereby incorporated by reference in its entirety to the maximum extent allowable by law.

TECHNICAL FIELD

The present disclosure generally concerns electronic devices and, more particularly, one-time programmable memories.

BACKGROUND

Certain types of memory devices and particularly one-time programmable memory devices (OTP), operate by associating a transistor with a capacitive element. The memory cell (an oxide forming the dielectric of the capacitive element) has a native state (after manufacturing) with a given resistance which is relatively high defining a first state (arbitrarily 0). During a step of cell programming to a second state (arbitrarily 1), the transistor sends a signal which enables the break down of the oxide, which makes it conductive with a given resistance which is relatively low.

Current OTP memories occupy a surface area of several hundreds of square micrometers on the substrates of electronic chips.

Further, the resistance of the oxide of "broken down" OTP memory cells is difficult to control. This generates a dispersion of resistance values between the different memories of a same batch, which is not satisfactory.

There is a need for an OTP memory enabling to at least partially overcome one or a plurality of disadvantages of existing devices, such as the size of OTP memories and/or the resistance dispersion of the oxide when the latter has broken down.

SUMMARY

An embodiment enables to at last partially decrease the size of OTP memories while using a buried gate transistor. OTP memory cells of small size, for example, having a size smaller than 30 $\mu m^2$, are thus obtained.

An embodiment enables to at least partially improve the resistance dispersions of the oxide once broken down by focusing the charges originating from the transistor during programming of the second state towards a specific location of the oxide of the capacitive element.

An embodiment provides a one-time programmable memory cell comprising: a transistor comprising: at least a first conductive gate element arranged in at least a first trench formed in a semiconductor substrate; at least a first channel portion buried in the substrate and extending at the level of at least a first lateral surface of the first conductive gate element; and a capacitive element forming a memory element; said first channel portion being coupled to an electrode of the capacitive element.

In an embodiment, the first channel portion is formed according to a first doping type.

In an embodiment, the first channel portion is separated from the first conductive gate element by a first insulator layer.

In an embodiment, the capacitive element comprises: a second insulator layer arranged on a first surface of the substrate; at least one second conductive element formed on the second insulator layer; and an electrode, formed according to the first doping type, in the substrate and in front of at least a portion of the second conductive element, the second insulator layer being at least partly arranged between the electrode and the second conductive element.

In an embodiment, the capacitive element comprises a second portion formed in the substrate, in contact with the second insulator, and arranged between the electrode of the capacitive element and the first channel portion of the transistor, the second portion being formed according to a second doping type with a dopant concentration greater than a dopant concentration of the substrate.

In an embodiment, the transistor comprises at least one channel biasing portion arranged in contact with the first channel portion, the channel biasing portion being formed according to the first doping type with a dopant concentration greater than a dopant concentration of the first channel portion and separated from the first conductive gate element by the first insulator layer.

In an embodiment, the transistor comprises at least one source formed in the substrate and arranged in contact with the first channel portion, the source being formed according to the second doping type and separated from the first conductive gate element by the first insulator layer.

In an embodiment, the memory cell further comprises a third conductive element, electrically insulated from the first conductive gate element and the substrate, and at least partly arranged in said at least one first trench.

In an embodiment, the third conductive element is further arranged in the substrate and surrounds at least an assembly formed by the transistor and the capacitive element.

In an embodiment, the third conductive element is coupled to an electric ground.

In an embodiment, the first conductive gate element is further arranged in at least a second trench formed in the substrate, the first channel portion extending at least between the first trench and the second trench.

In an embodiment, the first channel portion further extends at the level of at least one second lateral surface of the first conductive gate element.

An additional embodiment provides an electronic device comprising: at least such a memory cell; and a control circuit configured to apply a first voltage in the range from 5 to 15 Volts between the first conductive gate element and the source, and to apply a second voltage in the range from 5 to 15 Volts between the first conductive gate element and the channel biasing portion.

In an embodiment, the control circuit is configured to apply a voltage greater than 5 Volts between the second conductive element and the electrode of the capacitive element.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms “front”, “rear”, “top”, “bottom”, “left”, “right”, etc., or relative positions, such as terms “above”, “under”, “upper”, “lower”, etc., or to terms qualifying directions, such as terms “horizontal”, “vertical”, etc., it is referred to the orientation of the drawings or to a normal position of use.

Unless specified otherwise, the expressions “around”, “approximately”, “substantially” and “in the order of” signify within 10%, and preferably within 5%.

Figure 1:
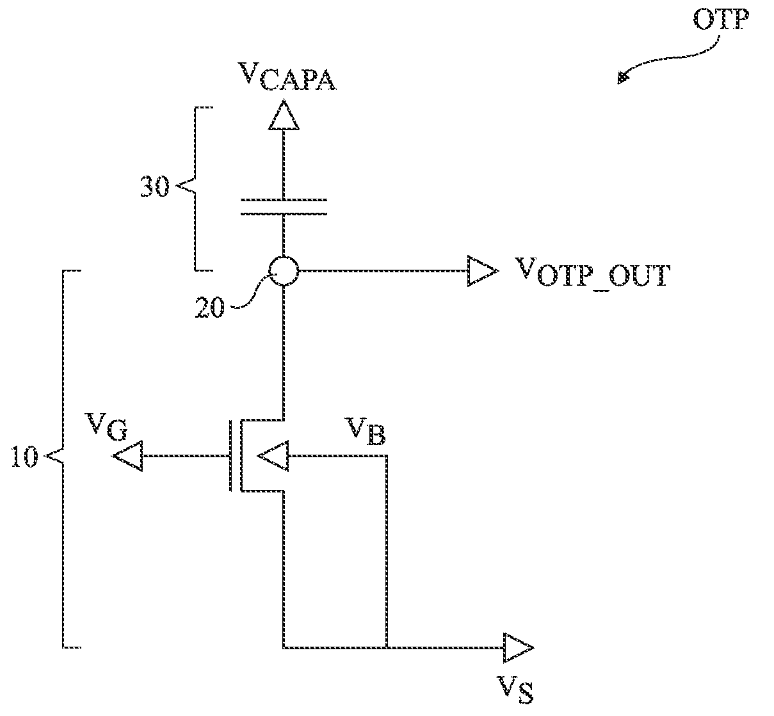
FIG. 1 schematically illustrates a circuit of an OTP memory cell according to an embodiment.

FIG. 1 schematically shows an OTP memory cell.

The OTP memory cell comprises a transistor 10 and a capacitive element 30 (forming a memory element) coupled in series between power supply voltage rails. Transistor 10 is, for example, a MOS transistor comprising a source, a drain, a gate, and a substrate contact. The source of transistor 10 is, for example, coupled to a first voltage rail, which is, for example, at a reference potential $V_S$, such as the ground. The substrate contact is, for example, also coupled to the source. A substrate potential $V_B$ is thus, for example, equal to the ground potential. The transistor drain is, for example, coupled to an intermediate node 20 between transistor 10 and capacitive element 30, for example delivering an output voltage $V_{OTP\_OUT}$ of the OTP. Capacitive element 30, for example, comprises a first electrode coupled to intermediate node 20 and a second electrode coupled to a second voltage rail, which is, for example, at a power supply potential $V_{CAPA}$ of the OTP memory cell.

Before the step of breaking down of the oxide of the capacitive element, the gate, the source, and the channel biasing region of transistor 10 are, for example, all at the same potential, for example, at 0 Volts, i.e. at ground. In other words, voltages $V_G$, $V_S$, and $V_B$ are, for example, equal to 0 Volts with respect to ground. The voltage applied across the capacitive element, that is, between $V_{CAPA}$ and intermediate node 20, is, for example, also kept equal to zero.

In an example, to enable to break down the oxide of capacitive element 30, voltage $V_{CAPA}$ is taken to a programming value, which is, for example, equal to or greater than 5 Volts, voltage $V_G$ is taken to an activation value of transistor 10, which is, for example, greater than 5 Volts, and in the range from 5 Volts to 15 Volts, and voltages $V_S$ and $V_B$ remain, for example, at 0 Volts.

The readout phase, for example, comprises measuring the resistance between terminals $V_{CAPA}$ and $V_{OTP\_OUT}$. If the breakdown step has not occurred, the resistance is higher. If the breakdown step has occurred, the resistance is lower. For example, voltage $V_{CAPA}$ is taken to a readout value, which is for example equal to 2 Volts, and by activating transistor 10, the level of voltage $V_{OTP\_OUT}$ depends on the resistance between terminals $V_{CAPA}$ and $V_{OTP\_OUT}$, and thus on the programming state of the OTP cell.

Figure 2:
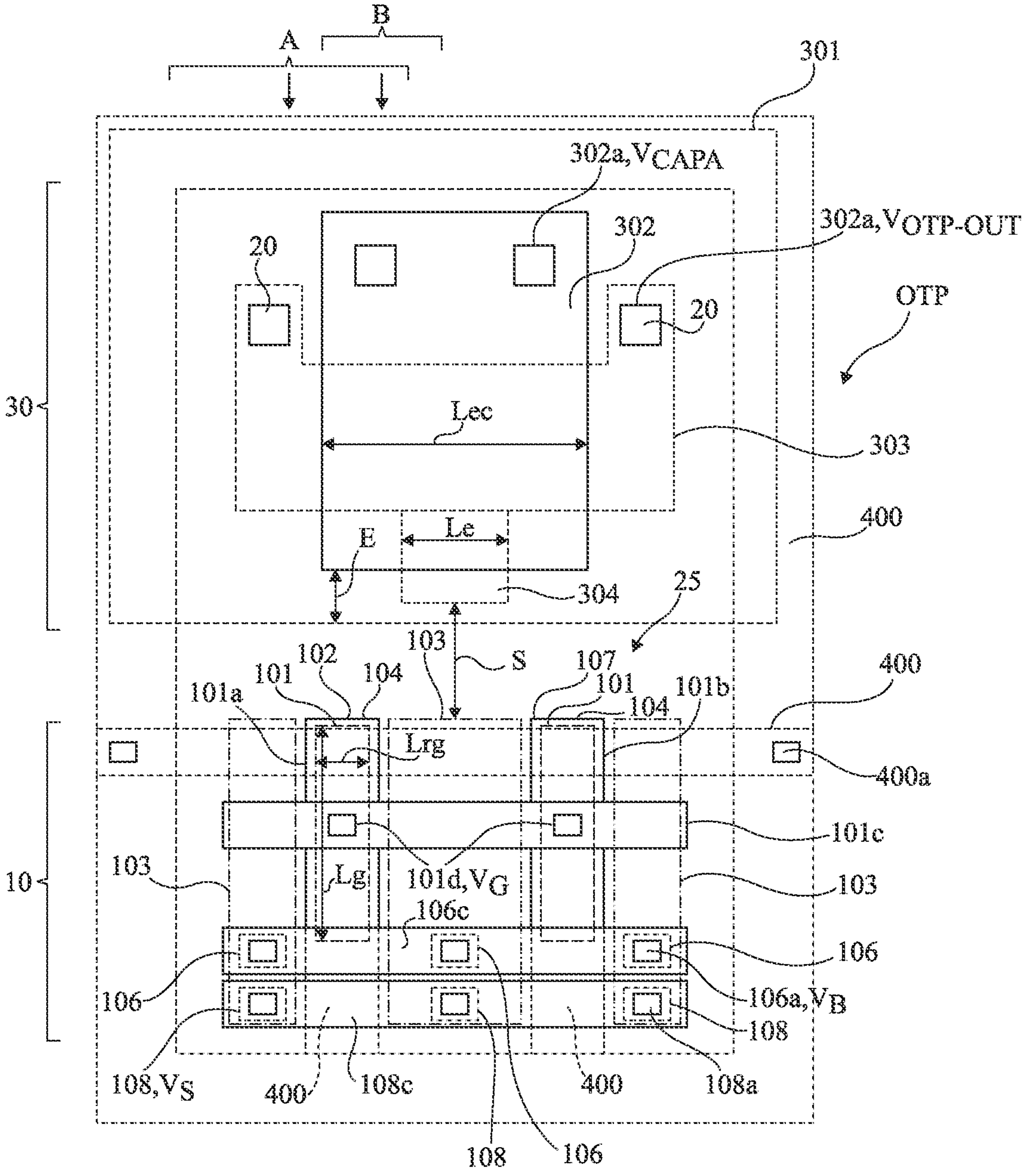
FIG. 2 is a top view of an OTP memory cell according to an embodiment.

FIG. 2 is a top view of an embodiment of an OTP memory cell, for example integrating the circuit of FIG. 1.

Transistor 10 comprises at least one first conductive gate element 101. In other words, the first conductive gate element 101 forms the gate of transistor 10. In the example of FIG. 2, the first conductive gate element 101 is formed in a first trench 102 and in a second trench 107, themselves formed in a semiconductor substrate 25. Although first conductive gate element 101 is formed in the two trenches, in other embodiments, first conductive gate element 101 is formed in a single trench, such as first trench 102 or second trench 107. The fact of having first conductive gate element 101 formed in a first trench 102 and in a second trench 107 enables to increase the surface area of the channel of transistor 10.

In an example, first conductive gate element 101 has a widthwise dimension, that is, a width taken approximately parallel to a first surface of substrate 25, which is smaller than the dimension extending depthwise in the trench. This enables to limit the size of the OTP memory cell and also enables to ease the breakdown of the oxide of capacitive element 30 by increasing the generated current. The electric contacting on first conductive gate element 101 occurs at the level of contacts 101*d* arranged above the first surface of substrate 25 through a passivation oxide present at the surface of substrate 25. First conductive gate element 101 is surrounded, in the first and/or in the second trench 102, 107, by a first insulating layer 104 to electrically insulate it from the substrate and/or from other conductors. In an example, first insulator layer 104 has a thickness in the range from 35 to 45 nanometers.

In the present description, the first surface of substrate 25 similarly designates an external surface of the substrate or the surface of the passivation oxide that may be present at the surface of the substrate, and which is oriented towards substrate 25.

In an example, first insulator layer 104 is formed with a silicon oxide or a silicon nitride.

In an example, first conductive gate element 101 is formed with polysilicon.

In an example, the length Lg of first conductive gate element 101 is in the range from 3 to 4 micrometers, this length extending parallel to the first surface of substrate 25.

In an example, the width Lrg of first conductive gate element 101 is in the range from 0.4 to 0.8 micrometers.

In the example of FIG. 2, transistor 10 further comprises a first channel portion 103. In other words, the channel of transistor 10 is formed by first channel portion 103. First channel portion 103 is buried in substrate 25 and, for example, extends at the level of at least a first lateral surface 101*a* of first conductive gate element 101. Lateral surface 101*a* is, for example, approximately oriented so that a normal to lateral surface 101*a* is parallel to the first surface of substrate 25. The term “buried” means that first channel portion 103 extends depthwise in the substrate. In other words, first channel portion 103 forms a three-dimensional structure having the approximate shape of a rectangle or of a square having two surfaces parallel to the first surface of the substrate and to a length of first conductive gate element 101. The height of this rectangle shape is, for example, equal to a height of first conductive gate element 101. In an example, the general shape of first channel portion 103 is similar to that of first conductive gate element 101.

In an example, first channel portion 103 has a first P doping type with a dopant concentration in the range from $7\times10^{19}$ to $2\times10^{20}$. $cm^{-3}$. However, those skilled in the art may modify, based on their knowledge, the different doping types, for example selected according to the doping type of substrate 25. Dopants such as aluminum, boron, gallium, or also indium may for example be used as P dopants for a silicon substrate.

In the example of FIG. 2 of a structure having two trenches 102, 107 and where first conductive gate element 101 is arranged in the first and the second trench 107, first channel portion 103, for example, extends at least between first trench 102 and second trench 107. First channel portion 103 may further extend, for example, similarly with respect to first surface 101*a*, at the level of at least one second lateral surface 101*b* of the first conductive gate element 101. This enables to further increase the channel conduction to ease the step of breakdown of the oxide of capacitive element 30.

In an example, substrate 25 is doped according to a first P doping type. In another example, substrate 25 is doped according to a second N doping type. In the rest of the description, the case of an N-type substrate is taken as an example. However, those skilled in the art may modify, based on their knowledge, the different doping types according to the selected doping type of substrate 25. Substrate 25 may be formed with silicon, germanium, a carbide such as SiC, a nitride such as GaN, or another semiconductor known by those skilled in the art. Dopants such as phosphorus or antimony may be used for the N doping for silicon.

In the example of FIG. 2, transistor 10 comprises at least one channel biasing portion 106, corresponding to the substrate contact and arranged to be in contact with first channel portion 103. One or a plurality of contacts 106*a* arranged at the surface of substrate 25 enable to bias channel biasing portion 106 with potential $V_S/V_B$ (the two contacts being shorted).

A plurality of channel biasing portions 106 may be formed if the first channel portion 103 is arranged in a plurality of locations as illustrated in the example of FIG. 2.

In an example, channel biasing portion 106 is formed according to the first P doping type with a dopant concentration which is, for example, greater than a dopant concentration of first channel portion 103.

In an example, channel biasing portion 106 has a dopant concentration in the range from $1\times10^{17}$ to $5\times10^{17}$ at. $cm^{-3}$.

In an example, channel biasing portion 106 is separated from first conductive gate element 101 by first insulator layer 104.

In the example of FIG. 2, transistor 10 comprises a source 108 formed in substrate 25 and arranged in contact with first channel portion 103. A plurality of sources 108 may be formed if first channel portion 103 is arranged in a plurality of locations as in the example of FIG. 2.

In an example, source 108 is formed according to the second N doping type. The dopant concentration of the source is, in an example, greater than that of substrate 25.

In the example of FIG. 2, source 108 is separated from first conductive gate element 101 by first insulator layer 104.

In an example, one or a plurality of contacts 108*a*, arranged at the surface of substrate 25, enable to apply potential Vs to source 108.

In the example of FIG. 2, the different channel biasing portions 106 of a same transistor 10 may be connected to one another by a conductive track 106*c*.

In the example of FIG. 2, the different sources 108 of a same transistor 10 may be connected together by a conductive track 108*c*.

In the example of FIG. 2, the different first conductive gate elements 101 of a same transistor 10 may be connected by a conductive track 101*c*.

In the example of FIG. 2, the OTP memory cell further optionally comprises a third conductive element 400. Third conductive element 400 is electrically insulated from first conductive gate element 101 and from substrate 25. Third conductive element 400 is, for example, at least partly arranged in first trench 102, and in second trench 107 if the latter is present.

Third conductive element 400 is, for example, a field plate. It is, for example, made of polysilicon.

In the example of FIG. 2, third conductive element 400 is arranged at least under first conductive gate element 101, that is, at the bottom of trench 102, 107. In other words, first conductive gate element 101 is arranged between third conductive element 400 and the first surface of substrate 25. This enables to limit the influence of the high voltages developed by gates 101 on the rest of substrate 25.

In an example, third conductive element 400 is coupled to an electric ground. This enables to improve the insulation of the OTP memory cell from electric disturbances and/or to insulate the rest of substrate 25 from the high voltages developed by the components of the OTP memory cell.

In the example of FIG. 2, third conductive element 400 is further arranged in substrate 25 to surround at least one assembly formed by the transistor 10 and the capacitive element 30 of the OTP memory cell. In an example, in the portion where third conductive element 400 is not formed in trenches 102, 107, third conductive element 400, for example, extends from the first surface of substrate 25 down to a depth equivalent to the trench depth.

Contacts 400*a* may be formed on the first surface of substrate 25 to be able to bias third conductive element 400, for example, to ground.

The use of this third conductive element 400 further enables to limit the size of the OTP memory cells on substrate 25. Indeed, the use of insulation trenches coupled to insulation well connections, taking more space, is then avoided.

In the example of FIG. 2, the OTP memory cell further comprises capacitive element 30 which is used to form the memory element.

First channel portion 103 is coupled to an electrode of capacitive element 30 located, for example, in substrate 25. In other words, the drain of transistor 10 is formed by a portion of substrate 25 located between first channel portion 103 and the electrode of capacitive element 30 formed in substrate 25. This enables to direct the charges originating from first channel portion 103 to the oxide of capacitive element 30. The term “coupled” here means that first channel portion 103 can transfer charges and/or an electric potential to the electrode of the capacitive element directly or indirectly via a second optional portion 304.

In the example of FIG. 2, capacitive element 30 comprises a second insulator layer 301 arranged on the first surface of substrate 25. The term “insulating layer” is the synonym of the term oxide. In other words, second insulator layer 301 is broken down after the programming. The term “on” here means that second insulator layer 301, in other words the oxide, may be formed above and in contact with the first surface of substrate 25 or at the same level as the first surface of substrate 25 or, for example, under the first surface of the substrate but in contact with the first surface. Second insulator layer 301 may be formed, in an example, by silicon dioxide. In an example, the thickness of second insulator layer 301 is in the range from 5 to 10 nanometers, and is for example approximately 6 or 7 nanometers.

Capacitive element 30 further comprises a second conductive element 302 formed on second insulator layer 301. Second conductive element 302 forms one of the two electrodes of capacitive element 30. Second conductive element 302 is for example formed with polysilicon. In an example, second conductive element 302 is formed in relief with respect to substrate 25. Contacts 302*a* may be formed to apply to second conductive element 302 potential $V_{CAPA}$.

Capacitive element 30 also comprises an electrode 303. This electrode is formed, in an example, according to the first P doping type, in substrate 25. In an example, the dopant concentration of this electrode 303 is greater than the dopant concentration of channel 103. For example, the dopant concentration of this electrode 303 is in the range from $1\times10^{19}$ to $7\times10^{19}$ at. $cm^{-3}$. In an example, electrode 303 is formed in front of at least a portion of second conductive element 302.

In an example, second insulator layer 301, for example, the oxide layer, is at least partly arranged between electrode 303 and second conductive element 302. In the example of FIG. 2, second insulator layer 301 extends, along the first surface of substrate 25 in top view, beyond second conductive element 302 by a distance E in the range from 0.4 to 1 micrometer, and beyond electrode 303 towards transistor 10. This enables to duplicate the contacts used for the reading from the memory cell. In another example, second insulator layer 301 is limited to the physical extension of second conductive element 302 along the first surface of substrate 25.

Contacts 303*a* may be formed through substrate 25 and second insulator layer 301 to detect, on second conductive element 303, potential $V_{OTP\text{-}OUT}$.

In the example of FIG. 2, capacitive element 30 optionally comprises a second portion 304 formed in substrate 25. In an example, second portion 304 is in contact with second insulator 301 and also, for example, with electrode 303. In an example, second portion 304 is arranged between the electrode 303 of capacitive element 30 and the first channel portion 103 of transistor 10. In the example of FIG. 2, the extension of second portion 304 is limited, along the first surface of substrate 25, to a width Le smaller than the width Lec of second conductive element 302. This is advantageous to concentrate the charges originating from first channel portion 103 and thus enable to accurately and reproducibly obtain the resistance of second insulator layer 301 after breakdown, at the level of second portion 304 and/or of the interface between second portion 304 and conductive element 302. Second portion 304 and conductive element 302 can thus be seen as one and the same electrode.

To improve the charge concentration at the level of second portion 304, the latter is, for example, formed according to the second N doping type with a dopant concentration greater than a dopant concentration of substrate 25. In an example, the dopant concentration of second portion 304 is in the range from $1\times10^{19}$ to $7\times10^{19}$ at. $cm^{-3}$. Those skilled in the art may modify the doping type or the concentration according to the substrate doping for example or according to the doping of electrode 303 or to the doping of first channel portion 103.

In the example of FIG. 2, second portion 304 is separated, in substrate 25, by a distance S of approximately 0.5 micrometers from first channel portion 103. In this example, second portion 304 may be arranged in front and/or at a similar depth with respect to at least a portion of first channel portion 103. This enables to further improve the charge concentration towards second portion 304 at the time of breaking down oxide 301. It is thus possible to accurately control which portion of the oxide has broken down.

Figure 3:
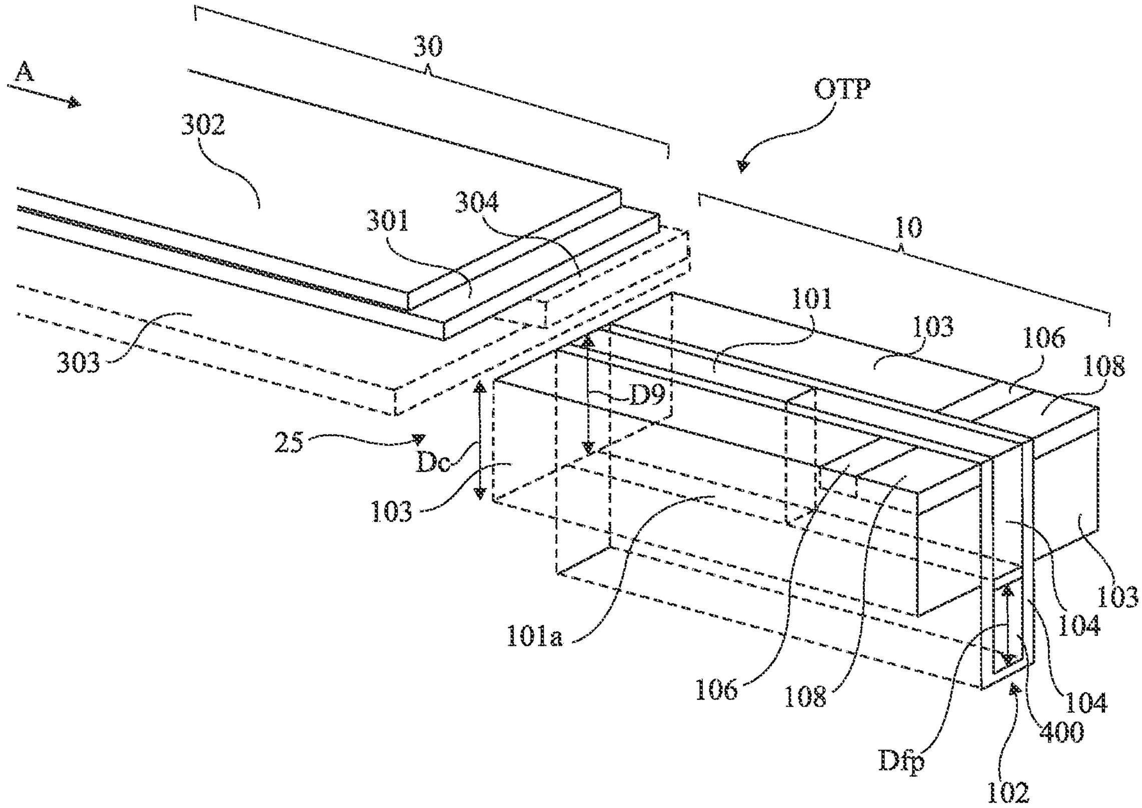
FIG. 3 is a perspective view of an OTP memory cell at the level of area A of FIG. 2.

FIG. 3 is a simplified perspective view of an embodiment of an OTP memory cell at the level of area A of FIG. 2, where the substrate is made transparent for a better understanding.

FIG. 3 enables, among others, to also view the arrangement between gate 101 and this conductive element 400 at the level of trenches 102.

First conductive gate element 101 is arranged in an upper portion of first trench 102. The edges of first trench 102 are covered with first insulator layer 104. First insulator layer 104 is also arranged in an upper portion of the trench located to the right of gate 101 in FIG. 3. This enables to insulate gate 101 particularly from channel biasing portion 106 and/or from source 108.

In FIG. 3, it is visible that first channel portion 103 is arranged along approximately the same depth as first conductive gate element 101.

In an example, first channel portion 103 extends in depth Dc with respect to the first surface of the substrate from 0.5 to 1.5 micrometers.

In FIG. 3, it is visible that third conductive element 400 is arranged in a lower portion, that is, deeper, of first trench 102. The depth Dpf of third conductive element 400 is, for example, in the range from 1.5 to 2.5 micrometers. Third conductive element 400 is electrically insulated from first conductive gate element 101 by first insulator layer 104 which stretches approximately parallel to the first surface of substrate 25 between first conductive gate element 101 and third conductive element 400. This conductive element 400 is also insulated from substrate 25 by first insulator layer 104.

In an example, the height, in other words the depth Dg relative to the first surface of substrate 25, of first conductive gate element 101, is in the range from 0.5 to 1.5 micrometers.

Figure 4:
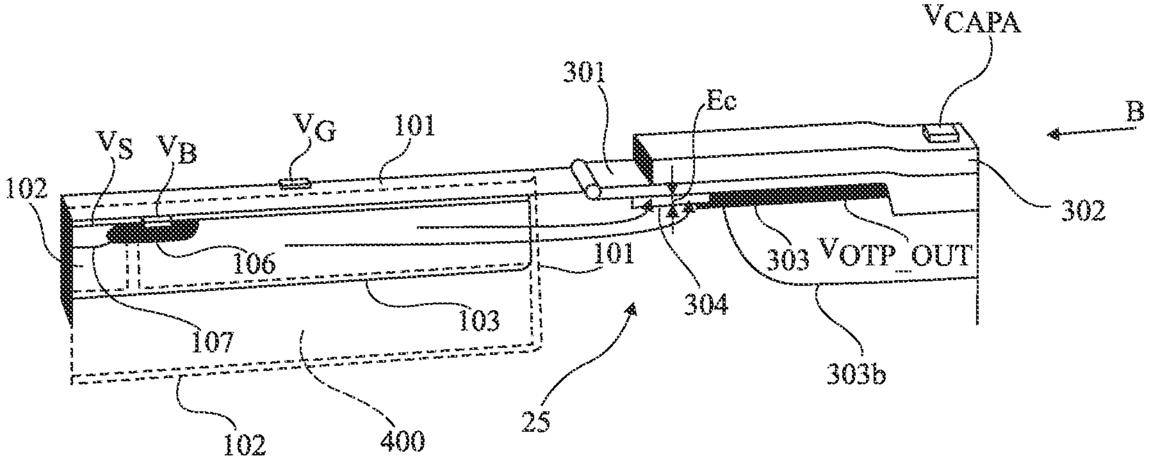
FIG. 4 is a perspective view of an OTP memory cell at the level of area B of FIG. 2.

FIG. 4 is a simplified cross-section view of an embodiment of an OTP memory cell at the level of area B of FIG. 2 and seen from the right-hand side in the orientation of FIG. 2.

FIG. 4 enables to have an example of the arrangement of second insulator layer 301 with respect to the first surface of substrate 25.

First conductive gate element 101 and third conductive element 400 are illustrated in dotted lines since they are set back. Second portion 304 is partly arranged vertically in line with second conductive element 302. Second insulator layer 301 extends beyond second portion 304 and second conductive element 302. In the example of FIG. 4, second portion 304 is thinner than electrode 303 and is in contact with second insulator layer 301. A thickness Ec of second portion 304 is, for example, in the range from 100 to 500 nanometers.

In the example of FIG. 4, a portion of second insulator layer 301, located at the far right in the drawing, may, for example, be thicker and deeper in substrate 25 with respect to its thickness at the level of second portion 304. This enables to electrically insulate the memory cell.

In the example of FIG. 4, first channel portion 103 is separated from second portion 304 by a portion of substrate 25.

When the voltage $V_G$ applied to gate 101 is for example greater than 5 Volts and voltages $V_S$ and $V_B$ are, for example, kept equal to zero and the voltage $V_{CAPA}$ of external electrode 302 is for example greater than 5 Volts, a significant number of electric charges is generated in first channel portion 103 all along the height of first channel portion 103 which extends in front of first conductive gate element 101. These charges are then concentrated, as shown by the arrows in FIG. 4, on second portion 304, which has decreased dimensions with respect to second insulating layer 301 and with respect to second conductive element 302 which forms the external electrode of capacitive element 30. These decreased dimensions and/or the higher dopant concentration at the level of second portion 304, with respect to the dopant concentration of substrate 25, enable to accurately locate the charges and control the area where oxide 301 will break down. The resulting resistance dispersion is thus limited.

The number of charges is proportional to the surface developed by all the vertical surfaces of first channel portion 103 which are in front of first conductive gate element 101. This charge generation surface being vertical, conversely to a transistor where the channel is only formed at the surface, this enables to significantly decrease the bulk of the OTP memory cell.

In the example of FIG. 4, the capacitive element further comprises a portion 303*b* doped according to the first P doping type, arranged in contact with electrode 303 and formed in substrate 25 under electrode 303. This portion 303*b* enables to electrically insulate the cell due to a well and to read the state of each of the memory cells.

Figure 5:
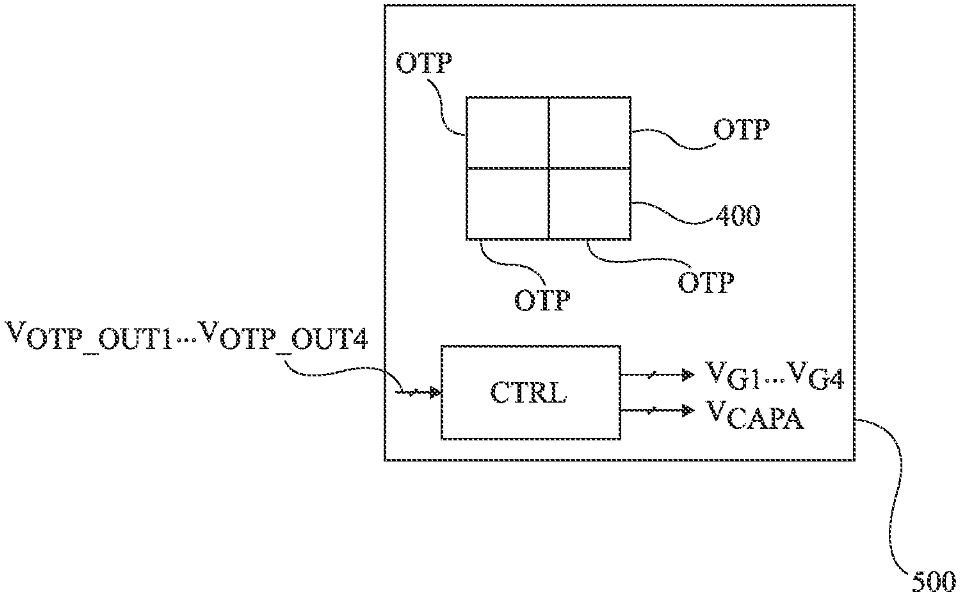
FIG. 5 is a top view of an electronic device comprising four OTP memory cells according to an embodiment.

FIG. 5 illustrates, in top view, an electronic device 500 comprising four OTP memory cells such as described in the previous examples. Other examples of electronic devices 500, not illustrated, may comprise from one to several hundreds of OTP memory cells such as described in the previous examples.

In the example of FIG. 5, the OTP memory cells are each surrounded with third conductive element 400. This enables to insulate the OTP memory cells from one another and from possible external disturbances. Between two adjacent memory cells, a single third conductive element 400 is present. In other words, a single third conductive element 400 is common for two adjacent OTP memory cells. This enables to limit the size of OTP memory cells on substrate 25. Such electronic devices 500 have a small size and controlled oxide resistances.

Electronic device 500, for example, further comprises a control circuit CTRL configured to apply, during an operation of programming of one or a plurality of OTP memory cells, corresponding gate voltages, according to the value of the data bit to be stored in each cell. In the example of FIG. 5, four gate voltages $V_{G1}$, $V_{G2}$, $V_{G3}$ and $V_{G4}$ are generated by circuit CTRL to respectively control the four OTP cells. In certain cases, circuit CTRL is also configured to generate voltage $V_{CAPA}$, which is for example a voltage common to all cells, and/or to receive the output voltages $V_{OTP\_OUT1}$, $V_{OTP\_OUT2}$, $V_{OTP\_OUT3}$, and $V_{OTP\_OUT4}$ of one or a plurality of the OTP memory cells during a readout phase.

Various embodiments and variants have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given hereabove. In particular, the indicated doping types may be interchanged and adapted by those skilled in the art.

The invention claimed is:

1. A one-time programmable memory cell, comprising:
a transistor comprising:
at least one first conductive gate element arranged in at least a first trench formed in a semiconductor substrate; and
at least a first channel portion buried in the semiconductor substrate and extending in parallel with at least one first lateral surface of the at least one first conductive gate element; and
a capacitive element forming a memory element;
wherein said at least one first channel portion is coupled to an electrode of the capacitive element; and
wherein the capacitive element comprises:
a first insulator layer arranged on a first surface of the semiconductor substrate;
at least one second conductive element formed on the first insulator layer; and
an electrode formed according to the first doping type in the semiconductor substrate;
wherein the first insulator layer is arranged, at least partly, between the electrode and the at least one second conductive element.

2. The memory cell according to claim 1, wherein the at least one first channel portion is doped with a first doping type.

3. The memory cell according to claim 2, wherein the at least one first channel portion is separated from the at least one first conductive gate element by a second insulator layer.

4. The memory cell according to claim 1, wherein the capacitive element comprises a second portion formed in the semiconductor substrate in contact with the first insulator layer and arranged between the electrode of the capacitive element and the at least one first channel portion of the transistor;
wherein the second portion is doped with a second doping type having a dopant concentration greater than a dopant concentration of the semiconductor substrate.

5. The memory cell according to claim 4, wherein the transistor comprises at least a channel biasing portion arranged in contact with the at least one first channel portion;
wherein the channel biasing portion is doped with the first doping type having a dopant concentration greater than a dopant concentration of the at least one first channel portion and separated from the at least one first conductive gate element by a second insulator layer.

6. The memory cell according to claim 5, wherein the transistor comprises at least one source formed in the semiconductor substrate and arranged in contact with the at least one first channel portion;
wherein the source being is doped with the second doping type and separated from the at least one first conductive gate element by the second insulator layer.

7. A one-time programmable memory cell, comprising:
a transistor comprising:
at least one first conductive gate element arranged in at least a first trench formed in a semiconductor substrate; and
at least a first channel portion buried in the semiconductor substrate and extending in parallel with at least one first lateral surface of the at least one first conductive gate element; and a capacitive element forming a memory element;

wherein said at least one first channel portion is coupled to an electrode of the capacitive element; and a third conductive element that is electrically insulated from the at least one first conductive gate element and the semiconductor substrate and at least partly arranged below the at least one first conductive gate element in said at least one first trench.

8. The memory cell according to claim 7, wherein the third conductive element is further arranged in the semiconductor substrate and surrounds at least one assembly formed by the transistor and the capacitive element.

9. The memory cell according to claim 7, wherein the third conductive element is coupled to an electric ground.

10. The memory cell according to claim 1, wherein the at least one first conductive gate element is further arranged in at least one second trench formed in the semiconductor substrate; and, wherein the at least one first channel portion extends at least between the first trench and the second trench.

11. The memory cell according to claim 1, wherein the at least one first channel portion further extends at a level of at least one second lateral surface of the at least one first conductive gate element.

12. The memory cell according to claim 1, wherein the coupling of said at least one first channel portion to the electrode of the capacitive element is made by a portion of the semiconductor substrate.

13. An electronic device, comprising:

at least one OTP memory cell comprising:

a transistor comprising:

at least one first conductive gate element arranged in at least a first trench formed in a semiconductor substrate; and at least a first channel portion buried in the semiconductor substrate and extending in parallel with at least one first lateral surface of the at least one first conductive gate element; and a capacitive element forming a memory element;

wherein said at least one first channel portion is coupled to an electrode of the capacitive element; and a control circuit configured to apply a first voltage in a range from 5 to 15 Volts to the at least one first conductive gate element and to apply a second voltage in the range from 5 to 15 Volts between the at least one first conductive gate element and the channel biasing portion.

14. The device according to claim 13, wherein the control circuit is further configured to apply a voltage greater than 5 Volts between the second conductive element and an electrode of the capacitive element.

15. The device according to claim 13, wherein the capacitive element comprises:

an insulator layer arranged on a first surface of the semiconductor substrate;

at least one second conductive element formed on the second insulator layer; and an electrode formed according to the first doping type in the semiconductor substrate and in front of at least a portion of the at least one second conductive element, wherein the insulator layer is arranged, at least partly, between the electrode and the at least one second conductive element.

16. The device according to claim 15, wherein the capacitive element comprises a second portion formed in the semiconductor substrate in contact with the insulator layer and arranged between the electrode of the capacitive element and the at least one first channel portion of the transistor;

wherein the second portion is doped with a dopant concentration greater than a dopant concentration of the semiconductor substrate.

17. The device according to claim 16, wherein the transistor comprises at least a channel biasing portion arranged in contact with the at least one first channel portion;

wherein the channel biasing portion is doped with a dopant concentration greater than a dopant concentration of the at least one first channel portion and separated from the at least one first conductive gate element.

18. The memory cell according to claim 17, wherein the transistor comprises at least one source formed in the semiconductor substrate and arranged in contact with the at least one first channel portion;

wherein the source being is separated from the at least one first conductive gate element.

19. The device according to claim 13, further comprising a third conductive element coupled to an electric ground and that is electrically insulated from the at least one first conductive gate element and the semiconductor substrate and at least partly arranged in said at least one first trench.

20. The device according to claim 19, wherein the third conductive element is further arranged in the semiconductor substrate and surrounds at least one assembly formed by the transistor and the capacitive element.

* * * * *